(12) United States Patent
Cheng et al.

(10) Patent No.: US 9,312,173 B2
(45) Date of Patent: Apr. 12, 2016

(54) SELF-LIMITING SILICIDE IN HIGHLY SCALED FIN TECHNOLOGY

(71) Applicant: INTERNATIONAL BUSINESS MACHINES CORPORATION, Armonk, NY (US)

(72) Inventors: Kangguo Cheng, Schenectady, NY (US); Bruce B. Doris, Slinerlands, NY (US); Pouya Hashemi, White Plains, NY (US); Ali Khakifirooz, Los Altos, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/281,444

(22) Filed: May 19, 2014

(65) Prior Publication Data

US 2015/0332964 A1 Nov. 19, 2015

(51) Int. Cl.
*H01L 21/337* (2006.01)
*H01L 21/768* (2006.01)
*H01L 29/78* (2006.01)
*H01L 29/08* (2006.01)

(52) U.S. Cl.
CPC ...... *H01L 21/76889* (2013.01); *H01L 29/0847* (2013.01); *H01L 29/785* (2013.01)

(58) Field of Classification Search
CPC ............... H01L 29/7722; H01L 29/66416; H01L 29/1066; H01L 29/80; H01L 29/8083
USPC .................. 438/183, 192, 212, 655, 660
See application file for complete search history.

(56) References Cited

U.S. PATENT DOCUMENTS

| | | | |
|---|---|---|---|
| 6,015,753 A | 1/2000 | Lin et al. | |
| 6,835,656 B1 | 12/2004 | Besser et al. | |
| 7,390,707 B2 | 6/2008 | Kawamura et al. | |
| 7,732,289 B2 | 6/2010 | Wu et al. | |
| 8,466,027 B2 * | 6/2013 | Chen et al. | 438/283 |
| 8,766,319 B2 * | 7/2014 | Lai et al. | 257/192 |
| 2013/0001555 A1 | 1/2013 | Yin et al. | |

* cited by examiner

*Primary Examiner* — Quoc Hoang
(74) *Attorney, Agent, or Firm* — Tutunjian & Bitetto, P.C.; Daniel P. Morris

(57) ABSTRACT

A method of forming a metal semiconductor alloy on a fin structure that includes forming a semiconductor material layer of a polycrystalline crystal structure material or amorphous crystal structure material on a fin structure of a single crystal semiconductor material, and forming a metal including layer on the semiconductor material layer. Metal elements from the metal including layer may then be intermixed metal elements with the semiconductor material layer to provide a metal semiconductor alloy contact on the fin structure. A core of the fin structure of the single crystal semiconductor material is substantially free of the metal elements from the metal including layer.

3 Claims, 6 Drawing Sheets

SELF-LIMITING SILICIDE IN HIGHLY SCALED FIN TECHNOLOGY

BACKGROUND

1. Technical Field

The present disclosure relates to semiconductor devices, such as semiconductor devices including fin structures. The present disclosure further relates to processing of materials suitable for use in fin including structures.

2. Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method is disclosed for forming a metal semiconductor alloy on a fin structure that includes forming a semiconductor material layer of a polycrystalline crystal structure material or amorphous crystal structure material on a fin structure of a single crystal semiconductor material. A metal including layer may be formed on the semiconductor material layer of the polycrystalline crystal structure material or amorphous crystal structure material. Metal elements from the metal including layer may then be intermixed with the semiconductor material layer to provide a metal semiconductor alloy contact on the fin structure. The core of the fin structure of the single crystal semiconductor material is substantially free of the metal elements from the metal including layer.

In another embodiment, a method of forming a metal semiconductor alloy on a fin structure is provided that includes forming a gate structure on a channel portion of the fin structure, and forming a semiconductor material layer of a polycrystalline crystal structure material or amorphous crystal structure material on source and drain regions portions of the fin structure. The source and drain region portions of the fin structure are composed of a single crystal semiconductor material. A metal including layer is formed on the semiconductor material layer. Metal elements from the metal including layer are intermixed with the semiconductor material layer to provide a metal semiconductor alloy contact on the fin structure. A core of the fin structure of the single crystal semiconductor material is substantially free of the metal elements from the metal including layer.

In another aspect, a semiconductor device is provided that includes a fin structure comprising a source region, a drain region and a channel region. The channel region of the fin structure is between the source region and the drain region. At least the source region and the drain region of the fin structure have a width of 10 nm or less and are comprised of a single crystalline semiconductor including material. A gate structure is present on the channel region of the fin structure. Metal semiconductor alloy contacts are present on the source region and the drain region of the fin structure. Metal elements from the metal semiconductor alloy contacts are not substantially present in the source region and the drain region of the fin structure.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
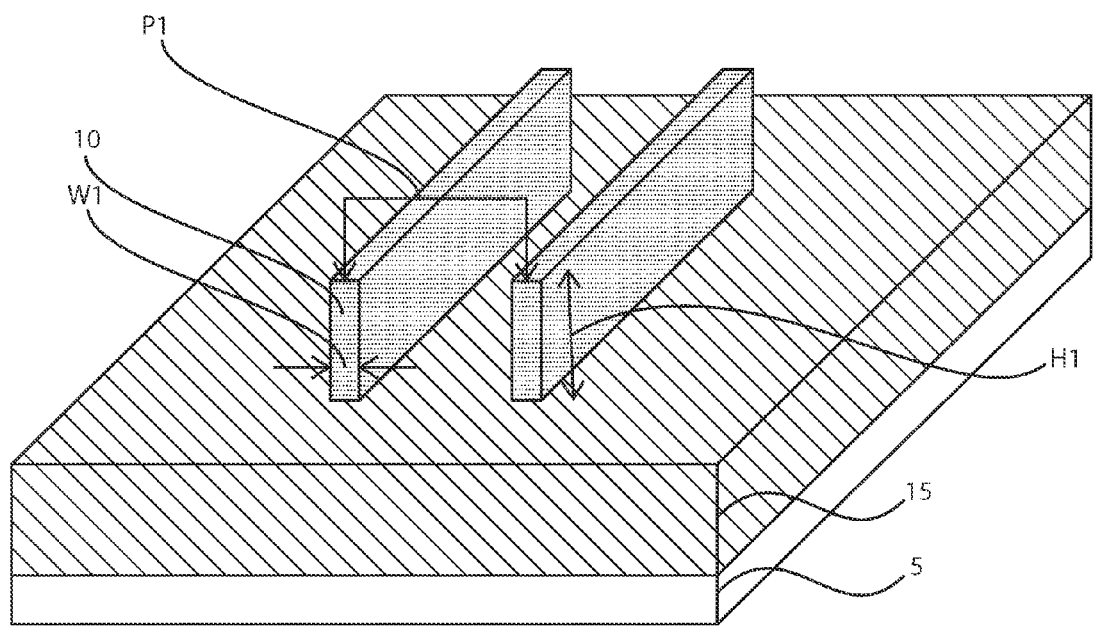
FIG. 1 is a perspective view that depicts forming at least two fin structures of single crystalline semiconductor material from a semiconductor on insulator (SOI) substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure.

In some embodiments, the methods and structures disclosed herein provide a wrap-around metal semiconductor alloy, e.g., silicide, that is formed on the fin structures of fin including semiconductor devices, wherein the wrap around silicide is formed in a self-limiting manner. In a 10 nm fin field effect transistor (finFET), the fin has a thickness of about 8 nm, when the pitch defining the spacing between adjacent fin structures is on the order of 40 nm or less. In some instances, conventional epitaxial merge structures that are formed between fin structures having dimensions similar to those provide in the above example may not have a sufficient contact area for optimum device performance. Typically, wrap-around contacts composed of metal semiconductor alloy, e.g., silicide, to fin structures increase the metal semiconductor alloy, e.g., silicide, to fin area, and can therefore reduce contact resistance. However, it has been determined that the drawback of a metal semiconductor alloy, e.g., silicide, wrap around contact on a narrow fin structure, such as fin structures having the above described dimensions, is that the formation of the metal semiconductor alloy may consume the entirety of the semiconductor material in the fin structure. For example, when forming a nickel silicide wrap around contacts onto a thin silicon fin structure, the high diffusion rate of nickel in silicon can result in the entire fin structure being converted to nickel silicide. It has been determined that if the entirety of the fin structure is converted to a metal semiconductor alloy, such as a silicide, the contact area for the metal semiconductor alloy to silicon semiconductor material of the fin structure is actually reduced, which results in an increased contact resistance. In some embodiments, the aforementioned disadvantages are overcome by a method that forms a self-limiting metal semiconductor alloy as a wrap-around contact to a fin structure. In some examples, the self-limiting characteristic of the metal semiconductor alloy, e.g., silicide, that is formed on the fin structure is provided by an epitaxial type deposition process that forms an in situ doped polycrystalline or amorphous semiconductor material on a single crystal semiconductor material. In some examples, the presence of the in situ doped polycrystalline or amorphous semiconductor material on the single crystal semiconductor material of the fin structure obstructs the metal elements from the metal materials used to form metal semiconductor alloy contacts from reaching the core of the fin structure that is composed of the he single crystal semiconductor material. The methods and structures of the present disclosure are now discussed with more detail referring to FIGS. 1-6.

FIG. 1 depicts one embodiment of forming a plurality of fin structures 10. In some embodiments, the fin structures 10 may be formed from a semiconductor on insulator (SOI) substrate or a bulk semiconductor substrate. In the embodiments that utilize an SOI substrate, the SOI substrate may include at least a semiconductor on insulator (SOI) layer overlying a dielectric layer, in which a base semiconductor layer may be present underlying the dielectric layer. In this example, the SOI layer is processed to provide the fin structure 10, the dielectric layer provides the isolation regions 15 that provide isolation between adjacent fin structures 10, and the base semiconductor layer provides the supporting substrate 5, as depicted in FIG. 1. The fin structures 10 may be formed from the SOI substrate, using photolithography and etch processes. In one example, the fin structures 10 may be formed from the SOI layer of an SOI substrate using sidewall image transfer (SIT) techniques. The etch process for forming the fin structures 10 may be an anisotropic etch, such as reactive ion etch, that etches through the entire thickness of the SOI layer stopping on the dielectric layer. For example, the etch process for forming the fin structures from the SOI layer of the SOI substrate may be selective to the dielectric layer, i.e., buried insulating layer, of the SOI substrate.

In the embodiments that utilize a bulk substrate to provide the fin structures 10, the fin structures 10 may be formed using photolithography and etch processes. For example, an etch mask may be formed on the upper surface of the bulk substrate, in which the portions of the bulk substrate that are exposed by the etch mask may be etched to form trenches. The etch process may be included within an sidewall image transfer (SIT) process flow. The trenches separate the portions of the bulk substrate that the etch mask is protecting, wherein the portions of the bulk substrate that are protected by the etch mask provide the fin structures 10. At least a portion of the trenches may then be filled with a dielectric material, such as an oxide, nitride or oxynitride, to provide the isolation regions 15 that separate the adjacent fin structures 10, as depicted in FIG. 1. In this embodiment, an unetched portion of the bulk substrate that is present underlying the fin structures 10 provides the supporting substrate 5. In another embodiment, the bulk substrate provides the supporting substrate 5 that is depicted in FIG. 1, and the material layers that provide the isolation regions 15 and the fin structures 10 are deposited onto the bulk substrate, or the material layers that provide the isolation regions 15 and the fin structures 10 are transferred onto the bulk substrate. The material layer for the fin structures 10 may then be patterned and etched to provide the fin structures 10.

In some embodiments, the fin structures 10 may be composed of a type IV semiconductor material or a compound semiconductor material. By "type IV semiconductor" it is meant that the semiconductor material includes at least one element from Group IVA (i.e., Group 14) of the Periodic Table of Elements. Examples of type IV semiconductor materials that are suitable for the fin structure include silicon (Si), germanium (Ge), silicon germanium (SiGe), silicon doped with carbon (Si:C), silicon germanium doped with carbon (SiGe:C) and a combination thereof. A compound semiconductor may be a III-V semiconductor material or a type II/VI semiconductor material. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. Examples of compound semiconductor materials that are suitable for the fin structures 10 include at least one of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The fin structures 10 typically have a single crystal crystalline structure. The term "single crystalline" denotes a crystalline solid, in which the crystal lattice of the entire sample is substantially continuous and substantially unbroken to the edges of the sample, with substantially no grain boundaries. For example, when the fin structure 10 is composed of silicon, the fin structure 10 may be composed of monocrystalline silicon.

Still referring to FIG. 1, each of the fin structures 10 may have a height $H_1$ ranging from 5 nm to 200 nm. In another embodiment, each of the fin structures 10 has a height $H_1$ ranging from 10 nm to 100 nm. In one example, each of the fin structures 10 has a height $H_1$ ranging from 20 nm to 50 nm. Each of the fin structures 10 may have a width $W_1$ of less than 15 nm. In another embodiment, each of the fin structures 10 has a width $W_1$ ranging from 3 nm to 8 nm. Although two fin structures 10 are depicted in FIG. 1, the present disclosure is not limited to only this example. It is noted that any number of fin structures 10 may be employed in accordance with the present disclosure. The pitch P1 separating adjacent fin structures 10 may range from 10 nm to 500 nm. In another example, the pitch P1 separating adjacent fin structures 10 may range from 20 nm to 50 nm.

The isolation region 15 may be composed of any dielectric material. For example, the isolation region 15 may be composed of an oxide, nitride or oxynitride material. In one example, when the isolation region 15 is composed of an oxide, the oxide may be silicon oxide. In another example, when the isolation region 14 is composed of a nitride, the nitride may be silicon nitride.

The supporting substrate 5 may be composed of a semiconductor material, dielectric or glass. For example, the supporting substrate 5 may be composed of at least one of silicon, a silicon carbon alloy (e.g., silicon doped with carbon (Si:C), silicon germanium (SiGe), a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors.

Figure 2:
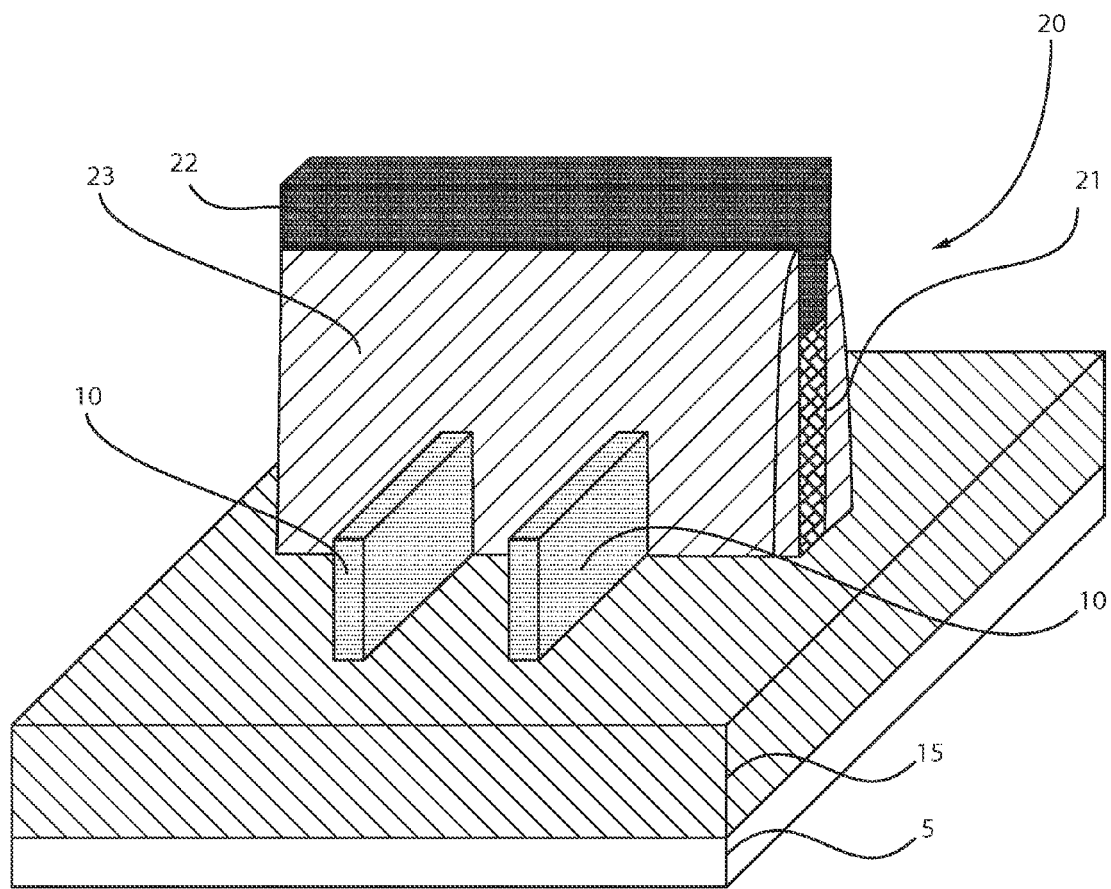
FIG. 2 is a perspective view depicting forming a sacrificial gate structure on a channel region portion of the fin structures, in accordance with one embodiment of the present disclosure.

FIG. 2 is a perspective view depicting forming a gate structure on a channel region portion of the fin structures. In the embodiment that is depicted in FIG. 2, the gate structure is a sacrificial gate structure that is a component of a replacement gate process for forming a semiconductor device. In a replacement gate process, a sacrificial gate structure is first formed on a channel region of the semiconductor device, wherein the sacrificial gate structure dictates the size and geometry of a later formed functional gate structure. By "sacrificial" it is meant that the structure is present during processing of the semiconductor device, but is removed from the semiconductor device prior to the device being completed. The "functional gate structure" operates to switch the semiconductor device from an "on" to "off" state, and vice versa.

In one embodiment, the sacrificial material that provides the sacrificial gate structure 20 may be composed of any material that can be etched selectively to the fin structures 10'. In some embodiments, the sacrificial gate structure 20 may include a sacrificial gate electrode 21 and a sacrificial gate cap 22. The layered structure of the sacrificial gate electrode 21 and the sacrificial gate cap 22 may be employed to facilitate selective deposition and selective etch process that are employed in later stages of the process flow for forming the semiconductor device. In one embodiment, the sacrificial gate electrode 21 of the sacrificial gate structure 20 may be composed of a silicon-including material, such as polysilicon. In one embodiment, the sacrificial gate cap 22 may be composed of a dielectric material, such as an oxide, nitride or oxynitride material, or amorphous carbon. The sacrificial gate structure 20 may be formed using deposition (e.g., chemical vapor deposition) photolithography and etch processes (e.g., reactive ion etching) to provide the sacrificial gate structure 20.

Still referring to FIG. 2, following formation of the sacrificial gate structure 20, a gate sidewall spacer 23 may be formed on the sidewalls of the sacrificial gate structure 20. The gate sidewall spacer 23 may be composed of a dielectric material, such as an oxide, nitride or oxynitride material. For example, the gate sidewall spacer 23 may be composed of silicon oxide ($SiO_2$) or silicon nitride ($Si_3N_4$). In one embodiment, the gate sidewall spacer 23 may be formed by using a blanket layer deposition, such as chemical vapor deposition (CVD), and an anisotropic etchback method. The gate sidewall spacer 23 may have a width ranging from 2.0 nm to 15.0 nm.

In some embodiments, after forming the sacrificial gate structure 20, the exposed portions of the fin structure 10, which are the source and drain region portions of the fin structure 10, may be doped with an n-type or p-type dopant. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on. The dopant type indicates the conductivity type of the source and drain region portions of the fin structure 10. As used herein, "p-type" refers to the addition of impurities to an intrinsic semiconductor that creates deficiencies of valence electrons. In a type IV semiconductor materials, such as a silicon including fin structure 10, examples of n-type dopants, i.e., impurities, include but are not limited to: boron, aluminum, gallium and indium. As used herein, "n-type" refers to the addition of impurities that contributes free electrons to an intrinsic semiconductor. In a type IV semiconductor, such as a silicon including fin structure 10, examples of n-type dopants, i.e., impurities, include but are not limited to antimony, arsenic and phosphorous. In some embodiments, the source and drain region portions of the fin structure 10 may be implanted with n-type or p-type dopant using ion implantation or gas phase doping. In other examples, a material layer that is doped with n-type or p-type dopant may be formed on the source and drain region portions of the fin structure, and the dopant may be driven from the doped material in to the fin structure 10 by thermal diffusion.

Figure 3:
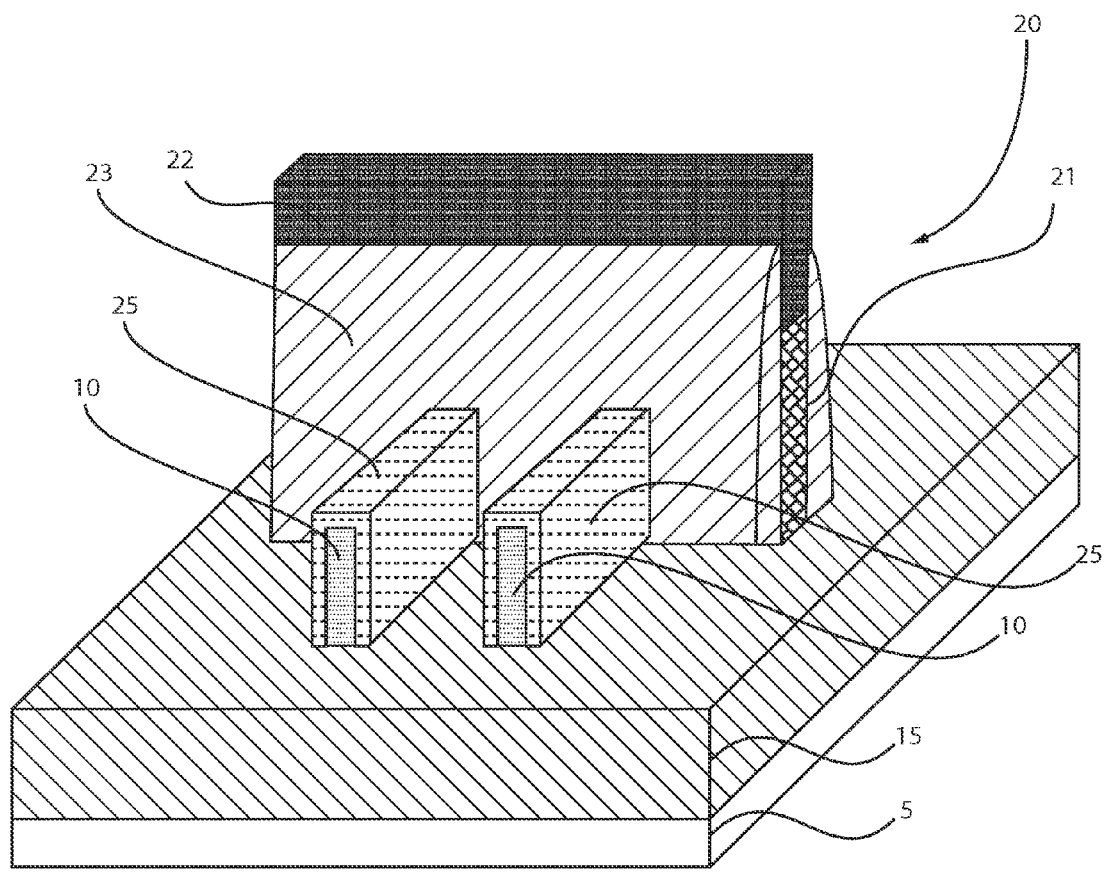
FIG. 3 is a perspective view depicting one embodiment of selectively growing in-situ doped amorphous or polycrystalline semiconductor material on the fin structures, in accordance with the present disclosure.

FIG. 3 depicts one embodiment of selectively growing in-situ doped amorphous or polycrystalline semiconductor material 25 on the fin structures 10. More specifically, the in situ doped amorphous or polycrystalline semiconductor material 25 is formed on the exposed surfaces of the source and drain region portions of the fin structures 10 that are not covered by the gate sidewall spacer 23 or the sacrificial gate structure 20. As used herein, the term "amorphous" denotes a non-crystalline material that lacks the long-range order characteristic of a crystal. As used herein, the term "polycrystalline" denotes a form of semiconductor material made up of randomly oriented crystallites and including large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns).

The in situ doped amorphous or polycrystalline semiconductor material 25 may be deposited using an epitaxial type deposition process on a semiconductor material having a single crystal crystalline structure, wherein the amorphous or polycrystalline crystal structure of the deposited material is provided by flowing the in situ dopant gas, e.g., n-type or p-type dopant gas, to the deposition surface prior to introducing the gas source for providing the base material, e.g., type IV semiconductor base material or compound semiconductor base material. By "in-situ" it is meant that the dopant e.g., n-type or p-type, that is being introduced to the base material, e.g., type IV semiconductor or compound semiconductor material, of the amorphous or polycrystalline semiconductor material 25 is introduced during the deposition step that forms the amorphous or polycrystalline semiconductor material 25. Typically, epitaxial deposition processing results in a semiconductor material having a crystalline structure that is the same as the deposition surface. For example, a conventionally epitaxially deposited material that is formed on a deposition surface composed of a single crystal semiconductor material will typically have a single crystalline crystal structure. In the present disclosure, it has been determined that by flowing the dopant gas for the in situ dopant to the source and drain region portions of the fin structure 10 having a single crystal crystalline structure, prior to flowing the source gas for the base material of being deposited material to the fin structure, the crystalline structure of the material being epitaxially deposited can be controlled so that the deposited material has an amorphous crystal structure or a polycrystalline crystal structure.

The amorphous or polycrystalline semiconductor material 25 may be composed of a type IV semiconductor material, such as a silicon including semiconductor or a germanium semiconductor, or a compound semiconductor material, such as type III-V semiconductor material or type II-VI semiconductor material. The amorphous or polycrystalline semiconductor material 25 may have the same composition as the fin structures 10 or a different composition from the fin structures 10. The above description of the material compositions that are suitable for the fin structures 10 are suitable for the description of the material compositions that may be used for the amorphous or polycrystalline semiconductor material 25. For example, when the amorphous or polycrystalline semiconductor material 25 is composed of a type IV semiconductor, the amorphous or polycrystalline semiconductor material 25 may be a silicon including material, such as amorphous silicon or polycrystalline silicon.

The amorphous or polycrystalline semiconductor material 25 is formed on the source and drain region portions of the fin structures 10 using a selective deposition process. In one embodiment, the selective deposition process provides that the material being deposited will form on one material surface, such as a semiconductor surface, but will not form on other material surfaces, such as dielectric and/or metal surfaces. For example, the deposition process for forming the amorphous or polycrystalline semiconductor material 25 may provide that amorphous or polycrystalline semiconductor material 25 is formed directly on the exposed semiconductor surfaces of the fin structure 10, but is not formed on the dielectric surfaces of the sacrificial gate cap 22 and/or the gate sidewall spacer 23.

The amorphous or polycrystalline semiconductor material 25 may be formed on the exposed upper surfaces and sidewall surfaces of the fin structure 10. In some examples, the amorphous or polycrystalline semiconductor material 25 is formed by a conformal deposition method, so that the thickness of the amorphous or polycrystalline semiconductor material 25 on the sidewall surface of the fin structure 10 is substantially the same as the thickness of the amorphous or polycrystalline semiconductor material 25 on the upper surface of the fin structure 10. The term "conformal" denotes a layer having a thickness that does not deviate from greater than or less than 30% of an average value for the thickness of the layer. In one embodiment, the thickness of the amorphous or polycrystalline semiconductor material 25 may range from 2 nm to 20 nm. In another embodiment, the thickness of the amorphous or polycrystalline semiconductor material 25 may range from 3 nm to 10 nm. It is noted that the above description for the thickness of the amorphous or polycrystalline semiconductor material 25 is provided for illustrative purposes only, and is not intended to limit the present disclosure, as other thicknesses have also been contemplated for use herein.

The amorphous or polycrystalline semiconductor material may be deposited using a chemical vapor deposition (CVD) method. Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

A number of different sources may be used for the amorphous or polycrystalline semiconductor material 25. In some embodiments, the gas source for the deposition of a silicon including material, such as polysilicon, is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. When the amorphous or polycrystalline semiconductor material 25 includes germanium, the germanium gas source may be selected from the group consisting of germane, digermane, halogermane, dichlorogermane, trichlorogermane, tetrachlorogermane and combinations thereof. It is noted that the above gas sources are provided for illustrative purposes only and are not intended to limit the present disclosure. Other gas sources for forming the base material of the amorphous or polycrystalline semiconductor material 25, so long as they provide a semiconductor material having an amorphous or polycrystalline semiconductor material.

The amorphous or polycrystalline semiconductor material 25 is formed using an in situ doping method. In one embodiment, the n-type dopant gas source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines suitable for use with the present disclosure include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type dopant gas source may include diborane ($B_2H_6$).

As indicated above, the amorphous or polycrystalline crystal structure of the deposited material, e.g., silicon and/or silicon germanium, may be provided by flowing the dopant gas source prior to flowing the source gas for the base material of the epitaxial deposition process. More specifically, in one example, the in situ doping gas of at least one of diborane ($B_2H_6$), arsine ($AsH_3$) and phosphine ($PH_3$) is flowed prior to the selective epitaxial deposition process that employs the epitaxial deposition gas source for forming the base material, e.g., silane, of the semiconductor material being deposited. Without wishing to be bound, but in the interest of further explaining some aspects of the present disclosure, the flow of the in situ dopant gas impacts the deposition surface, and may form a monolayer or multiple monolayers of the dopant material. This can obstruct, e.g., destroy, the lattice information of the underlying semiconductor lattice, e.g., silicon lattice, of the fin core. Material that is grown on top of the fin core will not find a lattice to arrange their growth onto. Therefore, the deposited semiconductor grows on the fin structure having an amorphous or poly-crystalline crystal structure. Additionally, the dopant monolayer can function as an additional stopping layer (also referred to as diffusion barrier) for obstructing the diffusion of metal elements from reaching the core of the fin structure during the subsequently described formation of the metal semiconductor alloy. In yet another embodiment, the dopant monolayer can help to provide for a good electrical contact between the subsequently formed metal semiconductor alloy and the core of the fin structure 10.

In some embodiments, the dopant concentration of n-type or p-type dopant that is present in the amorphous or polycrystalline semiconductor material 25 may range from $1 \times 10^{18}$ atoms/cm$^3$ to $1 \times 10^{22}$ atoms/cm$^3$. In another embodiment, the concentration of n-type or p-type dopant that is present in the amorphous or polycrystalline semiconductor material 25 may range from $5 \times 10^{19}$ atoms/cm$^3$ to $4 \times 10^{21}$ atoms/cm$^3$. In yet another embodiment, the concentration of n-type or p-type dopant that is present in the amorphous or polycrystalline semiconductor material 25 may range from $1 \times 10^{20}$ atoms/cm$^3$ to $1 \times 10^{21}$ atoms/cm$^3$.

Figure 4:
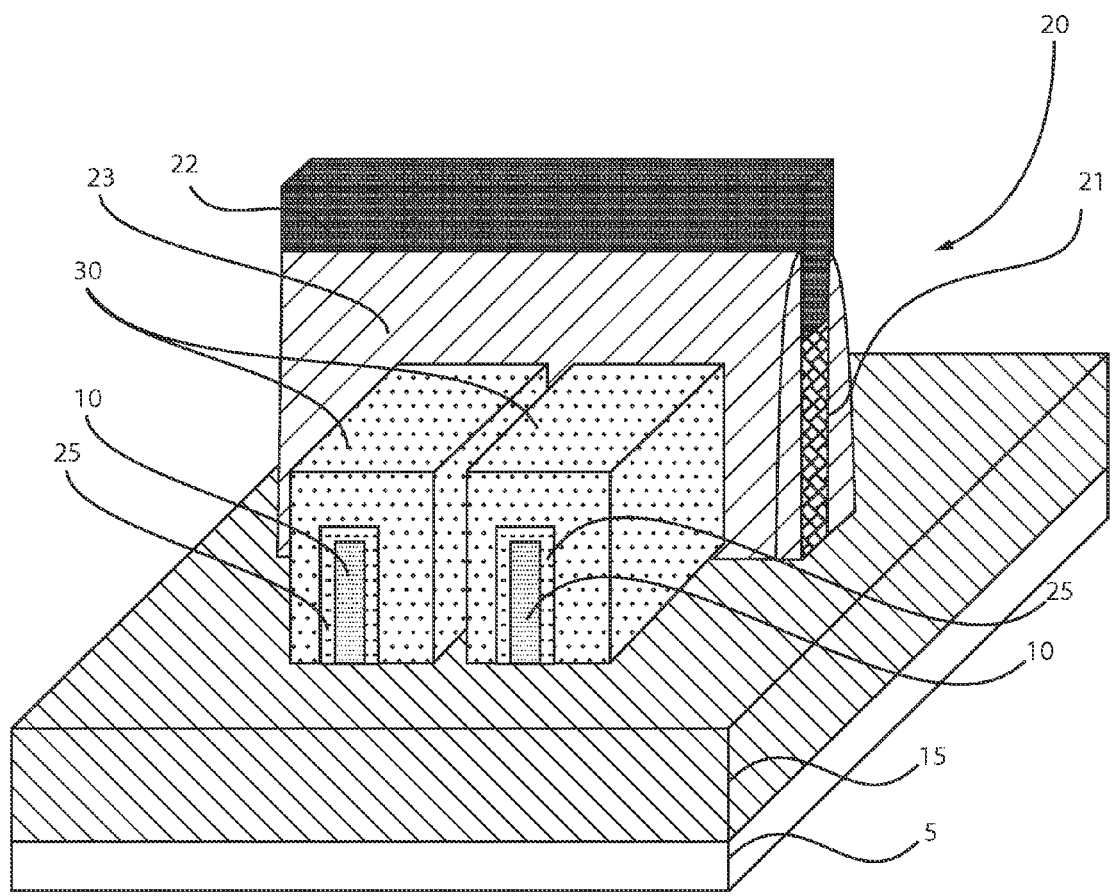
FIG. 4 is a perspective view depicting of depositing a metal layer on the in-situ doped amorphous or polycrystalline semiconductor material, in accordance with one embodiment of the present disclosure.

FIG. 4 depicts one embodiment of depositing a metal including layer 30 on the in-situ doped amorphous or polycrystalline semiconductor material 25. The metal including layer 30 may be composed of nickel (Ni), titanium (Ti), cobalt (Co), platinum (Pt), tantalum (Ta), tungsten (W), palladium (Pd) and other like materials. The metal including layer 30 is typically deposited using a physical vapor deposition (PVD) method, such as evaporation, plating, electroplating, sputtering, electrochemical deposition and combinations thereof. Examples of sputtering apparatus that may be suitable for depositing the metal including layer 30 include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD). The metal including layer 30 is typically formed over the source and drain region portions of the fin structure 10 directly on the in-situ doped amorphous or polycrystalline semiconductor material 25. The metal including layer 30 may have a thickness ranging from 2 nm to 20 nm. In another embodiment, the metal including layer 30 may have a thickness ranging from 5 nm to 10 nm.

In some embodiments, a photoresist mask may be formed over the sacrificial gate structure 20 prior to depositing the metal including layer 30, to obstruct the metal including layer 30 from being formed on the sacrificial gate structure. In other embodiments, the metal including layer 30 may be patterned and etched to remove portions of the metal including layer 30 that are present over the sacrificial gate structure 30. In other embodiments, the metal including layer 30 may be blanket deposited over the entire structure, wherein the portions of the metal including layer 30 that are formed on dielectric surfaces are removed, e.g., selectively etched, after the portions of the metal including layer 30 that are present on the source and drain region portions of the fin structure 10 are intermixed with semiconductor material to provide the metal semiconductor alloy 35 that is depicted in FIG. 5.

Figure 5:
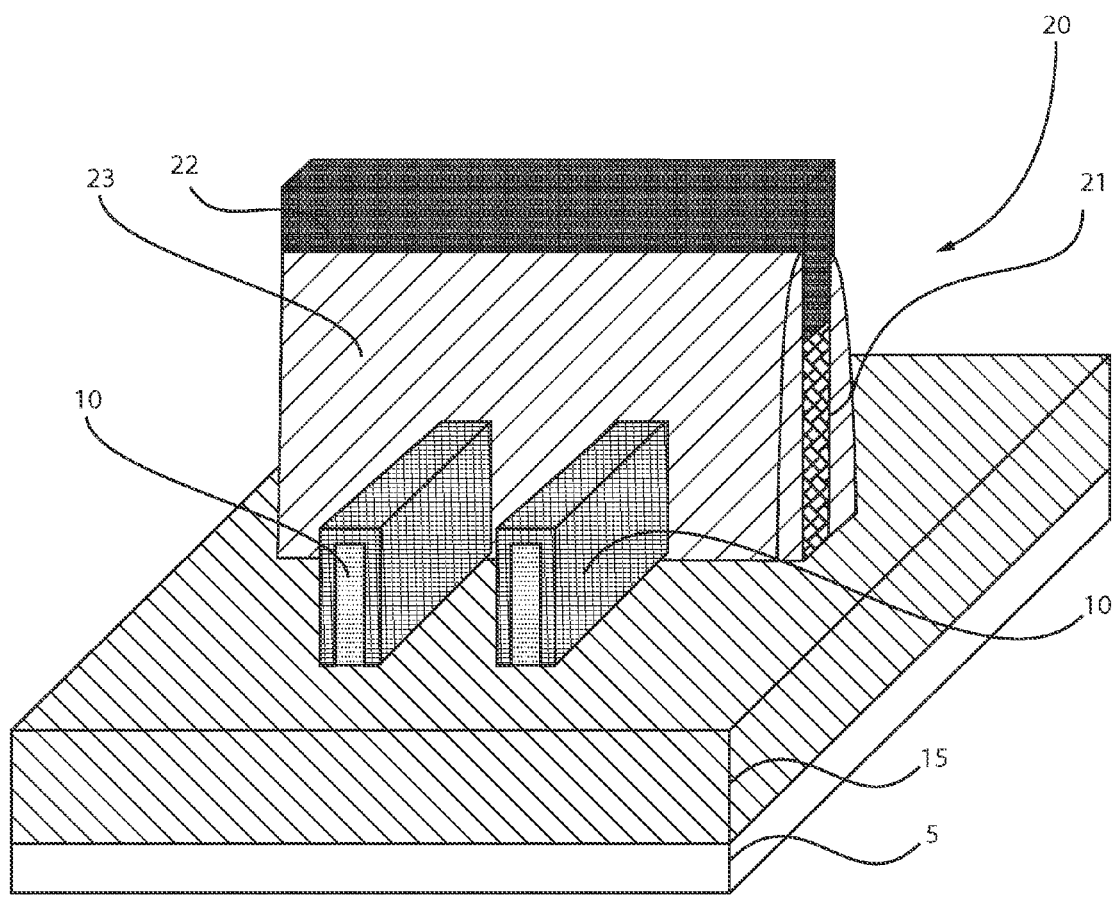
FIG. 5 is a perspective view depicting one embodiment of intermixing the metal element from the metal layer and the semiconductor element from the in-situ doped amorphous or polycrystalline semiconductor material to form a metal semiconductor alloy, in accordance with the present disclosure.

FIG. 5 depicts one embodiment of intermixing the metal element from the metal including layer 30 and the semiconductor element from the selectively grown in-situ doped amorphous or polycrystalline semiconductor material 25 to form a metal semiconductor alloy 35. As used herein, a "metal semiconductor alloy" is an alloy of a metal and semiconductor. In one embodiment, the metal semiconductor alloy is a silicide. A "silicide" is an alloy of a metal and silicon. Examples of silicides suitable for metal semiconductor alloy 35 that is formed on the source and drain region portions of the fin structure 10 include silicides having any of the aforementioned metals of the metal layer 30, including, but not limited to, nickel silicide ($NiSi_x$), erbium silicide, nickel platinum silicide ($NiPt_ySi_x$), platinum silicide (PtSi), cobalt silicide ($CoSi_x$), tantalum silicide ($TaSi_x$), titanium silicide ($TiSi_x$) and combinations thereof. It is noted that the metal semiconductor alloy 35 is not limited to only silicides, such as the above provided examples. Other silicides have also been contemplated for use as the metal semiconductor alloy 35, as well as germanides and other alloys of semiconductor and metal elements. In some embodiments, the metal semiconductor alloy 35 may also include an alloying additive including, but not limited to, Pt, Pd, Re, W or combinations thereof.

In some embodiments, intermixing at least one metal element from the metal layer 30 and at least one semiconductor element from the fin structures 10 to provide a metal semiconductor alloy 35 on the sidewalls and upper surface of the source region portion and the drain region portion of the fin structures 10 is provided by thermal diffusion. In some embodiments, the thermal diffusion step may include, but is not limited to, rapid thermal annealing, furnace annealing, laser annealing and combinations thereof. In one embodiment, the thermal diffusion is completed at a first temperature ranging from 350° C. to 600° C. for a time period ranging from 1 second to 90 seconds. In some embodiments, the thermal annealing process for forming the metal semiconductor alloy 35 includes a second annealing step at a higher second temperature that ranges from 600° C. to 800° C.

The metal semiconductor alloy 35 may have a thickness ranging from 5 nm to 35 nm. In another embodiment, the metal semiconductor alloy 35 may have a thickness ranging from 10 nm to 25 nm.

The portion of the metal including layer 30 that intermixes with the in-situ doped amorphous or polycrystalline semiconductor material 25 is the portion of the metal including layer 30 that provides the metal semiconductor alloy 35, and the portion of the metal including layer 30 that does not intermix with the in-situ doped amorphous or polycrystalline semiconductor material 25 may be referred to as the non-reacted portion of the metal including layer 30. In some embodiments, after forming the metal semiconductor alloy 35, the non-reacted portion of the metal including layer 30 is removed. The non-reacted portion of the metal including layer 30 may be removed using an etch that is selective to the metal semiconductor alloy 35. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The etch process for removing the non-reacted portions of the metal layer may be an anisotropic etch or an isotropic etch. In some examples, the etch process may be a wet chemical etch, reactive ion etch (RIE), plasma etch, laser etch and combinations thereof.

Forming the metal semiconductor alloy 35 by intermixing the metal elements from the metal including layer 30 and the semiconductor elements from the amorphous or polycrystalline semiconductor material 25 controls diffusion of the metal elements to obstruct the diffusion of the metal elements from reaching the core of the fin structure 10 that is composed of single crystal semiconductor material. Because metal elements, such as nickel (Ni), diffuse much faster in the amorphous or polycrystalline semiconductor material 25 much faster than in the single-crystalline fin structure 10, the metal element, e.g., nickel (Ni), diffuses and reacts with the amorphous layer or polycrystalline semiconductor material 25 and then stops once it reaches the single-crystalline material of the fin structure 10. In this manner, the metal semiconductor alloy 35 formed in accordance with the disclosed methods is self-limiting. The diffusion characteristics provided by the methods and structures disclosed herein results in only the amorphous layer or polycrystalline semiconductor material 25 being converted to a metal semiconductor alloy 35, while the single-crystalline fin structure 10 remains as the semiconductor core. By obstructing the metal elements from diffusing into the single-crystal fin structure 10, the methods and structures allow for the formation of metal semiconductor alloy contact structures on fin structures 10 without converting the entire fin structure 10 into a metal semiconductor alloy 35.

In some embodiments, the core of the fin structure 10 of the single crystal semiconductor material is substantially free of the metal elements from the metal layer 30. By "substantially free" it is meant that there is no metal from the metal including layer 30 in the core of the fin structure 10. The metal elements from the metal including layer 30 react with the amorphous or polycrystalline semiconductor material 25 so that there is no further propagation of the metal elements from the metal including layer 30 during the formation of the metal semiconductor alloy 35 beyond the amorphous or polycrystalline semiconductor material 25. More specifically, in some embodiments, the metal elements from the metal including layer 30 do not diffuse past the interface between the amorphous or polycrystalline semiconductor material 25 and the fin structure 10. Therefore, the metal semiconductor alloy contacts 35 are in direct contact with the core of the fin structure 10 that is composed of the single crystalline semiconductor material, in which there is no metal from the metal semiconductor alloy contacts present in the core of the fin structure 10.

The core of the single-crystalline fin structure 10 may have a width dimension ranging from 2 nm to 10 nm. In another embodiment, the core of the single-crystalline fin structure 10 may have a width dimension ranging from 3 nm to 8 nm. The core of the single-crystalline fin structure 10 may have a height ranging from 5 nm to 200 nm. In another embodiment, the core of the single-crystalline fin structure 10 may have a height ranging from 20 nm to 50 nm. The benefit of having a fin core of a semiconductor material having a single crystal crystalline structure, as opposed to the core of the fin structure being converted to a metal semiconductor alloy, is to reduce the contact resistance of the metal semiconductor alloy 35 to the fin structure 10. This is particularly beneficial for the fin structures 10 having a thickness of about 8 nm or less.

Figure 6:
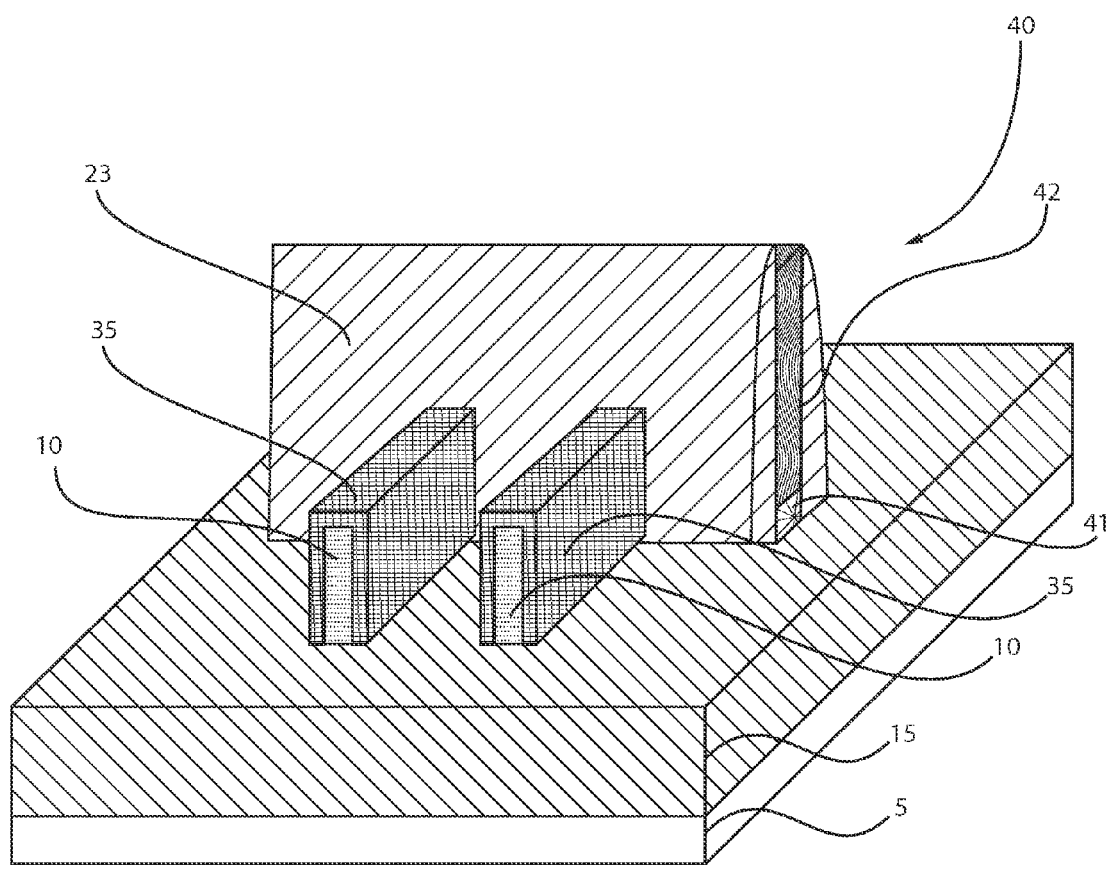
FIG. 6 is a perspective view of forming a functional gate structure on the channel region portion of the fin structure, in accordance with one embodiment of the present disclosure.

FIG. 6 depicts one embodiment of removing the sacrificial gate structure 20 and forming a functional gate structure 40 on the channel region portion of the fin structure 10. In some embodiments, the sacrificial gate structure 20 may be removed by a selective etch process that removes the sacrificial gate structure 20 selectively to the channel region of the fin structure 10, the gate sidewall spacer 23 and the metal semiconductor alloy 35 that is present on the source and drain region portions of the fin structure 10. The sacrificial gate structure 20 may be removed using a wet or dry etch process. In one embodiment, the sacrificial gate structure 20 is removed by reactive ion etch (RIE).

The functional gate structure 40 may be formed in the space previously occupied by the sacrificial gate structure 20. The functional gate structure 40 may include at least one gate conductor 42 and at least one gate dielectric 41, wherein the gate dielectric 41 is positioned between the gate conductor 42 and the channel region portion of the fin structures 10.

The gate dielectric 41 may be formed by a deposition process such as, e.g., chemical vapor deposition (CVD), plasma enhanced CVD (PECVD), metal organic chemical vapor deposition (MOCVD), atomic layer deposition (ALD), evaporation, chemical solution deposition and other like deposition processes. The gate dielectric 41 may also be formed utilizing a thermal growth process, such as thermal oxidation. In some embodiments, the gate dielectric 41 may be formed on the sidewalls of the gate sidewall spacer 23 and the channel portion of the fin structure 10.

The gate dielectric 41 may be comprised of an insulating material having a dielectric constant of about 4.0 or greater. In another embodiment, the gate dielectric 41 is comprised of an insulating material having a dielectric constant greater than 7.0. The dielectric constants mentioned herein are relative to a vacuum. In one embodiment, the gate dielectric 41 employed in the present disclosure includes, but is not limited to, an oxide, nitride, oxynitride and/or silicates including metal silicates, aluminates, titanates and nitrides. In one example, when the gate dielectric 41 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric 41 may vary, but typically, the gate dielectric 41 has a thickness from 1 nm to 10 nm. In another embodiment, the gate dielectric 41 has a thickness from 1 nm to 3 nm.

After forming the material layer for the gate dielectric 41, a conductive material is deposited on the gate dielectric 41 filling the space between the gate sidewall spacers 23 to form the gate conductor 42 of functional gate structure 40. The gate conductor 42 may be formed utilizing a deposition process, such as physical vapor deposition (PVD), chemical vapor deposition (CVD) or evaporation. The conductive material may comprise polysilicon, silicon germanium (SiGe), a silicide, a metal or a metal-silicon-nitride, such as Ta—Si—N. Examples of metals that can be used as the conductive material include, but are not limited to, Al, W, Cu, and Ti or other like conductive metals. The layer of conductive material for the gate conductor 42 may be doped, e.g., n-type doped, or undoped.

Interconnects may also be formed to the metal semiconductor alloy 35 that is present on the source and drain regions of the fin structure 10. Forming the interconnects may begin with forming an interlevel dielectric layer over the source and drain region portions of the fin structure 10, and forming an opening through the interlevel dielectric layer to expose the metal semiconductor alloy 35 that is present on the source and drain region portions of the fin structure 10. In a following process step, the interconnects may be formed by forming an electrically conductive material, such as a metal, in the opening through the interlevel dielectric layer so that the interconnect is in electrical communication with the metal semiconductor alloy 35.

The above described replacement gate process for forming the functional gate structure 40 may also be referred to as "gate last" process flow. It is noted that the present disclosure is not limited to only gate last process flows. For example, a "gate first" process flow is equally applicable to the above method for forming a metal semiconductor alloy 35. In a gate first process flow, a functional gate structure is formed prior to forming the source and drain regions, wherein the functional gate structure remains in the final structure of the device being formed.

In another aspect, the present disclosure provides a semiconductor device, e.g., FinFET semiconductor device, which includes a fin structure 10 comprising a source region, a drain region and a channel region, wherein the channel region is present between the source region and the drain region. At least one of the drain region and the source region of the fin structure has a width of 10 nm or less and is comprised of a single crystalline semiconductor material. A functional gate structure 40 is present on the channel region of the fin structure 10. Metal semiconductor alloy contacts 35 are present on the source region and the drain region of the fin structure, wherein metal elements from the metal semiconductor alloy contacts are not substantially present in the core of the fin structure 10, wherein the cores is composed of a semiconductor material having a single crystal crystalline structure, such as monocrystalline silicon. By "not substantially present" it is meant that there is no metal from the metal semiconductor alloy contacts 35 in the core of the fin structure 10. As described above, the metal elements from the metal including layer 30 react with the amorphous or polycrystalline semiconductor material 25 so that there is no further propagation of the metal elements beyond the amorphous or polycrystalline semiconductor material 25. Therefore, the metal semiconductor alloy contacts 35 are in direct contact with the core of the fin structure that is composed of the single crystalline semiconductor material, in which there is no metal from the metal semiconductor alloy contacts present in the core of the fin structure.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a metal semiconductor alloy on a fin structure comprising:
    forming a sacrificial gate structure on a channel portion of the fin structure;
    forming a semiconductor material layer of a polycrystalline crystal structure material or amorphous crystal structure material on source and drain regions portions of the fin structure that have a single crystal semiconductor material after forming the sacrificial gate structure;
    forming a metal including layer on the semiconductor material layer of the polycrystalline crystal structure material or the amorphous crystal structure material;
    intermixing metal elements from the metal including layer with the semiconductor material layer to provide a metal semiconductor alloy contact on the fin structure, wherein a core of the fin structure of the single crystal semiconductor material is substantially free of the metal elements from the metal including layer; and
    replacing the sacrificial gate structure with a functional gate structure after forming the metal semiconductor alloy contact.

2. The method of claim 1, wherein the gate structure is a functional gate structure comprising at least one gate dielectric layer and at least one gate conductor layer.

3. The method claim 1, wherein the functional channel includes at least one gate dielectric layer on the channel portion of the fin structure, and at least one gate conductor on the at least one gate dielectric.

* * * * *